(12) United States Patent
Asaba et al.

(10) Patent No.: US 7,750,281 B2
(45) Date of Patent: Jul. 6, 2010

(54) CMOS IMAGE SENSOR WITH CURRENT MIRROR

(75) Inventors: Tetsuo Asaba, Suwon-si (KR); Jung-Chak Ahn, Yongin-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 12/319,862

(22) Filed: Jan. 13, 2009

(65) Prior Publication Data
US 2009/0189057 A1 Jul. 30, 2009

(30) Foreign Application Priority Data
Jan. 24, 2008 (KR) ............... 10-2008-0007515

(51) Int. Cl.
*H01L 27/00* (2006.01)
*H04N 5/335* (2006.01)
(52) U.S. Cl. ............... 250/208.1; 250/214 A; 348/308; 257/292
(58) Field of Classification Search ............. 250/208.1, 250/214 A; 348/294, 300, 301, 302, 308; 257/291, 292
See application file for complete search history.

(56) References Cited

U.S. PATENT DOCUMENTS

| | | | | |
|---|---|---|---|---|
| 6,518,910 B2 * | 2/2003 | Sakuragi et al. ............ | 341/162 |
| 6,833,869 B1 * | 12/2004 | Okamoto .................... | 348/294 |
| 7,012,645 B1 | 3/2006 | Tsai .......................... | 348/308 |
| 7,030,357 B2 | 4/2006 | Lee ........................... | 250/208.1 |
| 7,139,024 B2 * | 11/2006 | Lu et al. ..................... | 348/303 |
| 2004/0017494 A1 * | 1/2004 | Lu et al. ..................... | 348/294 |
| 2007/0075338 A1 * | 4/2007 | Park et al. .................. | 257/222 |
| 2009/0101798 A1 * | 4/2009 | Yadid-Pecht et al. ...... | 250/208.1 |
| 2009/0189057 A1 * | 7/2009 | Asaba et al. ............... | 250/208.1 |

OTHER PUBLICATIONS

Korean Patent Publication No. 100694463 to Yu, having Publication date of Mar. 6, 2007 (w/ English Abstract page).
Korean Patent Publication No. 1020040093999 to Lee, having Publication date of Nov. 9, 2004 (w/ English Abstract page).
Japanese Patent Publication No. 2004-336005 to Lee, having Publication date of Nov. 25, 2004 (w/ English Abstract page).

* cited by examiner

*Primary Examiner*—John R Lee
(74) *Attorney, Agent, or Firm*—Monica H. Choi

(57) ABSTRACT

An image sensor includes a pixel with a drive transistor and a select transistor. The drive transistor is driven according to a voltage at a floating diffusion node. The select transistor is coupled in series with the drive transistor for being turned on when the pixel is selected. The image sensor also includes a current mirror unit having first and second branches conducting mirrored currents. The first branch is coupled to the drive transistor, and the second branch is coupled to the select transistor at an output node of the pixel. With such biasing by the current mirror, gain drop in the drive transistor is minimized.

20 Claims, 8 Drawing Sheets

CMOS IMAGE SENSOR WITH CURRENT MIRROR

BACKGROUND OF THE INVENTION

This application claims priority under 35 USC §119 to Korean Patent Application No. 10-2008-0007515, filed on Jan. 24, 2008 in the Korean Intellectual Property Office, the disclosure of which is incorporated herein in its entirety by reference.

FIELD OF THE INVENTION

The present invention relates generally to image sensors, and more particularly, to a CMOS image sensor having pixels coupled to a current mirror for biasing.

BACKGROUND OF THE INVENTION

Charge-coupled devices (CCDs) and CMOS (complementary metal oxide semiconductor) image sensors (CISs) are typical image sensors. A CIS is more economical than a CCD since the CIS is manufactured using usual CMOS processes. The CIS is easily integrated with analog and digital signal processing circuits.

In addition, the CIS is adaptable to operate with low-power and low-voltage such that the CIS is widely used in portable devices such as mobile phones and digital cameras. A pixel array of the CIS includes a plurality of pixels arranged in a two-dimensional matrix of rows and columns, and each pixel outputs an image signal from light energy.

A CIS with high performance including reduced noise and maintained gain in the pixels is desired.

SUMMARY OF THE INVENTION

For such maintained gain, an image sensor according to an embodiment of the present invention includes a current mirror.

An image sensor according to an aspect of the present invention includes a pixel with a drive transistor and a select transistor. The drive transistor is driven according to a voltage at a floating diffusion node. The select transistor is coupled in series with the drive transistor for being turned on when the pixel is selected. The image sensor also includes a current mirror unit having first and second branches conducting mirrored currents. The first branch is coupled to the drive transistor, and the second branch is coupled to the select transistor at an output node of the pixel.

In another embodiment of the present invention, the image sensor further includes a photosensitive device, a transfer transistor, and a reset transistor. The photosensitive device accumulates charge in response to received light. The transfer transistor is coupled between the photosensitive device and the floating diffusion node. The transfer transistor turns on to transfer the charge accumulated in the photosensitive device to the floating diffusion node in response to a transfer control signal. The reset transistor is coupled between the floating diffusion node and a first voltage source. The reset transistor turns on to reset the floating diffusion node in response to a reset control signal.

In a further embodiment of the present invention, the photosensitive device is a photodiode including an N-type doped region and a P-type pinning layer. The N-type doped region is formed in a P-type semiconductor substrate. The P-type pinning layer is formed on the N-type doped region toward a surface of the P-type semiconductor substrate.

In another embodiment of the present invention, the transfer transistor is an NMOSFET (N-channel metal oxide semiconductor field effect transistors), and the reset transistor is a PMOSFET (P-channel metal oxide semiconductor field effect transistors).

In a further embodiment of the present invention, the image sensor also includes an N-well having the reset PMOSFET formed therein, and includes a butting contact formed onto a drain/source region of the reset transistor and onto a contact region of the N-well. The first voltage source applies a power supply voltage on the butting contact.

In another embodiment of the present invention, the drive transistor, the select transistor, and the reset transistor are formed along a line in the N-well.

In an alternative embodiment of the present invention, the image sensor includes another N-well having the drive transistor and the select transistor formed therein.

In that case, the image sensor also includes another butting contact formed onto a drain/source region of the select transistor and onto a contact region of the another N-well. An output voltage of the pixel is generated on the another butting contact that is floating. The drive transistor and the select transistor are formed along a line in the another N-well.

In a further embodiment of the present invention, the drive transistor and the select transistor are PMOSFETs. For example, the drive transistor is a depletion mode PMOSFET configured as a source follower.

In another embodiment of the present invention, the current mirror unit includes mirroring transistors and controlling transistors. The mirroring transistors form the first and second branches. The controlling transistors are coupled to the mirroring transistors for biasing the mirroring transistors. In addition, a controlling transistor determines a respective portion of the mirrored current flowing to the select transistor at the output node of the pixel.

In an example embodiment of the present invention, the mirroring transistors and the controlling transistors are NMOSFETs (N-channel metal oxide semiconductor field effect transistors).

In a further embodiment of the present invention, the image sensor further includes another pixel including another drive transistor and another select transistor being coupled to the first branch and the second branch, respectively, of the current mirror unit.

In this manner, the current mirror coupled to the drive transistor for biasing results in maintained gain of the drive transistor. In addition, use of the PMOSFET for the drive transistor results in reduced 1/f noise therein. Furthermore, use of the butting contacts reduces the area of the pixel. Also, use of the PMOSFET for the reset transistor enhances the complete resetting of the floating diffusion node of the pixel.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, 7, and 8 refer to elements having similar structure and/or function.

DETAILED DESCRIPTION OF THE INVENTION

Figure 1:
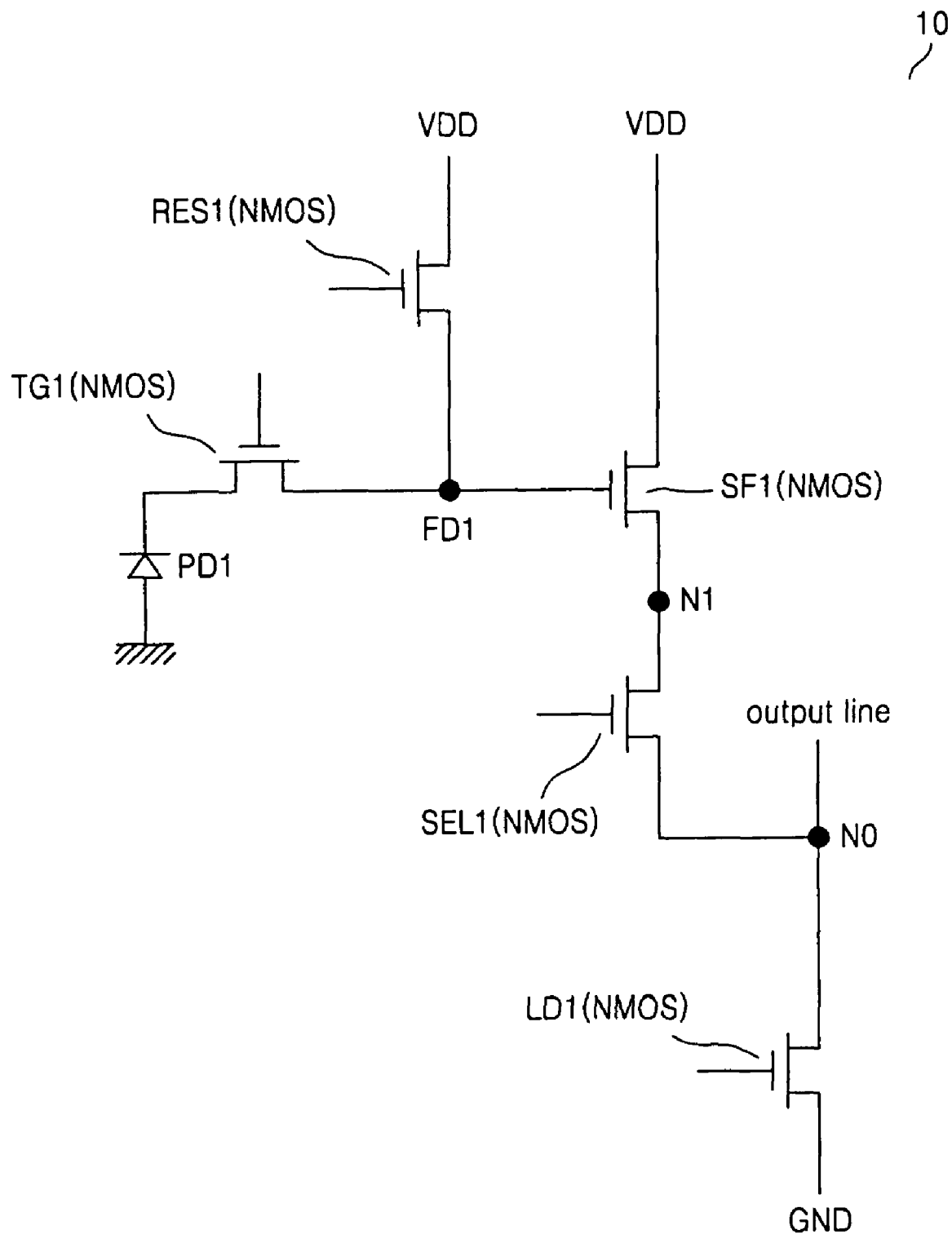
FIG. 1 shows a circuit diagram of a pixel in a conventional CMOS image sensor.

The present invention is now described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 shows a circuit diagram of a pixel 10 in a conventional CMOS image sensor. The pixel 10 includes a photodiode PD1, a transfer transistor TG1, a floating diffusion node FD1, a reset transistor RES1, a drive transistor SF1 configured as a source follower, a select transistor SEL1, and a load transistor LD1. The transfer transistor TG1, the reset transistor RES1, the drive transistor SF1, the select transistor SEL1, and the load transistor LD1 are NMOSFETs (N-channel metal oxide semiconductor field effect transistors) in the pixel 10.

The photodiode PD1 receives light generated from a light emitting source and accumulates electric charge from such received light. The transfer transistor TG1 transfers such accumulated charge to the floating diffusion node FD1 in response to a control signal applied at its gate. The floating diffusion node FD1 receives and stores the electric charge generated by the photodiode PD1 via the transfer transistor TG1.

The reset transistor RES1 is connected between the floating diffusion node FD1 and a first voltage source generating a first power supply voltage VDD. The reset transistor RES1 resets the floating diffusion node FD1 to the first power supply voltage VDD in response to a reset control signal.

The drive transistor SF1 is connected between the first power supply voltage VDD and a first node N1. The drive transistor SF1 is configured as a source follower that generates an output at the first node N1 that follows the voltage at the gate of the drive transistor SF1 (i.e., the floating diffusion node FD1).

The select transistor SEL1 is connected between the first node N1 and an output node N0 to form an electrical path between the first node N1 and the output node N0 in response to a select control signal. The load transistor LD1 is connected between the output node N0 and a ground voltage node GND. The load transistor LD1 enables an output line of the output node N0 in response to an output control signal.

In the conventional pixel 10 of FIG. 1, since the reset transistor RES1 is an NMOSFET, the floating diffusion node FD1 is not fully reset to the power supply voltage VDD because of a feed-through effect of the NMOSFFET RES1. As a result, the floating diffusion node FD1 is reset to a voltage that is lower than the power supply voltage VDD that has a low variation of voltage. The drive transistor SF1 is implemented as an NMOSFET having a surface channel with electric charge being trapped at such as surface channel resulting in 1/f noise.

Also in the conventional pixel 10 of FIG. 1, the node of the first power supply voltage VDD is used as an overflow drain. However, a potential barrier may be formed in the reset transistor RES1 and the drive transistor SF1 that are NMOSFETs since a P-well with a P-type dopant concentration is disposed below the node of the first power supply voltage VDD.

In that case, the node of the first power supply voltage VDD cannot be used as the overflow drain because of such a potential barrier. Moreover, since the reset transistor RES1 and the select transistor SEL1 are NMOSFETs, hot electrons may be generated when such transistors RES1 and SEL1 are turned on or off resulting in noise on display images from such hot electrons that have not been discharged.

Figure 2:
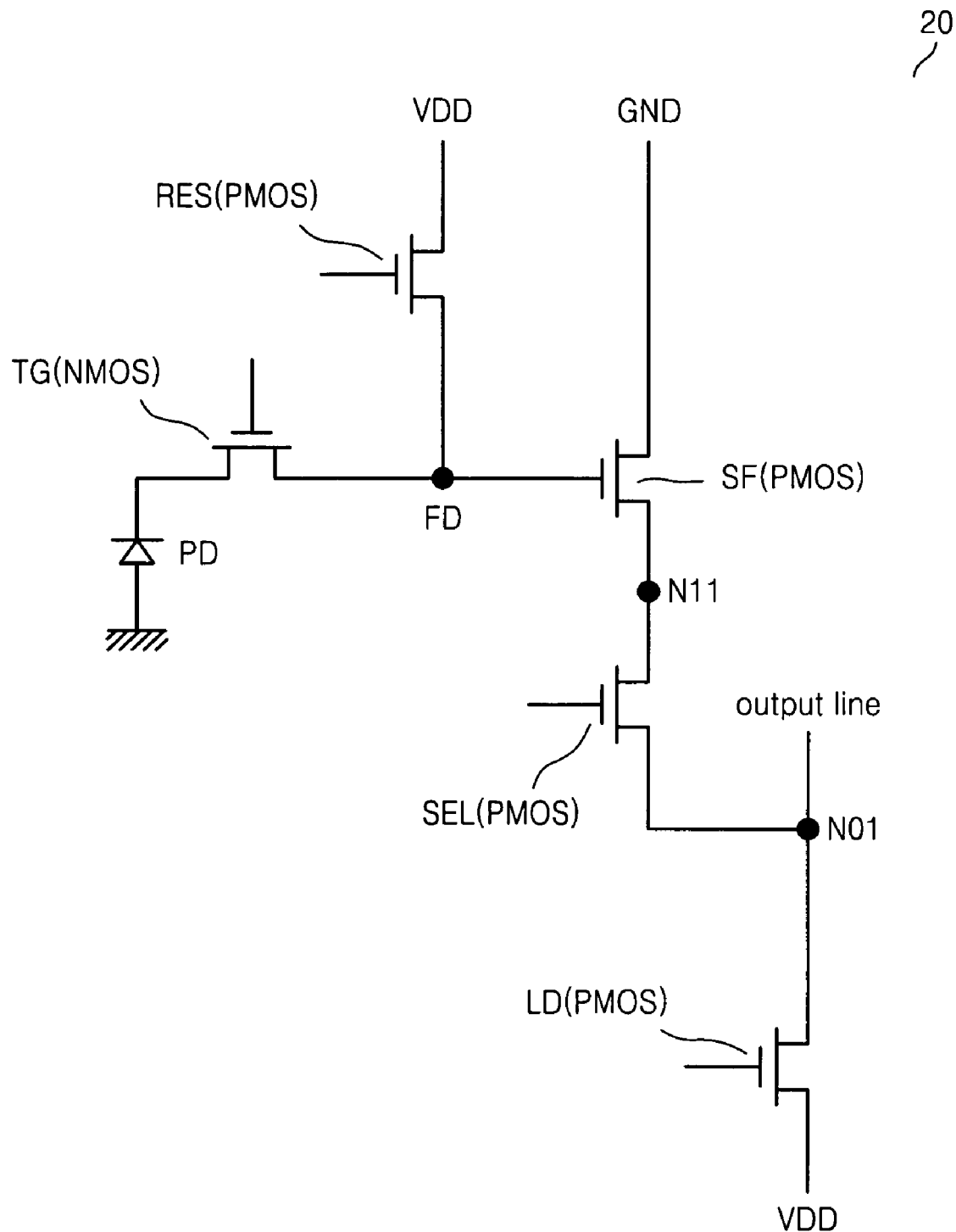
FIG. 2 shows a circuit diagram of a pixel in a CMOS image sensor according to an example embodiment of the present invention.

FIG. 2 shows a circuit diagram of an example pixel 20 in a CMOS image sensor according to an example embodiment of the present invention. The pixel 20 includes a photosensitive device such as a photodiode PD for example, a transfer transistor TG, a floating diffusion node FD, a reset transistor RES, a drive transistor SF that is configured as a source follower, a select transistor SEL, and a load transistor LD.

The photodiode PD receives light generated from a light emitting source to generate and accumulate electric charge. The transfer transistor TG transfers such accumulated charge to the floating diffusion node FD in response to a transfer control signal applied at its gate. The floating diffusion node FD is formed by a floating diffusion region for receiving and storing electric charge from the photodiode PD via the transfer transistor TG.

The reset transistor RES is connected between the floating diffusion node FD and a first voltage source supplying a first power supply voltage VDD. The reset transistor RES resets the floating diffusion node FD to the first power supply voltage VDD in response to a reset control signal. The reset transistor RES is an enhancement mode PMOSFET (P-channel metal oxide semiconductor field effect transistor) in an example embodiment of the present invention.

In that case, the reset transistor RES is turned on in response to a reset control signal at a logic low level that may be a ground voltage GND or a second power supply voltage (−VDD) that is a negative of the first power supply voltage VDD. The reset transistor RES that is turned on resets the floating diffusion node FD to the first power supply voltage VDD. The reset transistor RES that is the PMOSFET has minimized feed-through that is more prevalent in an NMOSFET. With such minimized feed-through, the floating diffusion node FD is reset fully to the first power supply voltage VDD.

The drive transistor SF is connected between a first node N11 and a second voltage source for providing a second power supply voltage that may be a ground voltage GND or the second power supply voltage (−VDD). The first node N11 is a source of the drive transistor SF that drives the first node N11 to follow the voltage at the gate of the drive transistor SF (i.e. at the floating diffusion node FD).

The drive transistor SF is a PMOSFET such as a depletion mode PMOSFET in an example embodiment of the present invention. In that case, a buried channel is automatically formed at the drive transistor SF for minimizing generation of 1/f noise therein. When the drive transistor SF is a depletion mode PMOSFET, the linearity of the voltage at the first node N11 is also increased.

The select transistor SEL is connected between the first node N11 and an output node N01. The select transistor SEL forms an electrical path between the first node N11 and the output node N01 when turned on in response to a select control signal. The select transistor SEL is an enhancement mode PMOSFET in an example embodiment of the present invention.

In that case, the select transistor SEL is turned on when the select control signal applied on its gate is at a logic low level that may be the ground voltage GND or the second power supply voltage (−VDD). When the select transistor SEL is the PMOSFET, hot carriers at the select transistor SEL are hot holes and are not hot electrons such that display noise due to hot electrons is minimized.

The load transistor LD is connected between the output node N01 and the first voltage source VDD for enabling an output line in response to an output control signal. The load transistor LD is an enhancement mode PMOSFET in an example embodiment of the present invention. In that case, the load transistor LD enables the output line when the output control signal applied on its gate is at a logic low level that may be the ground voltage GND or the second power supply voltage (−VDD).

Figure 3:
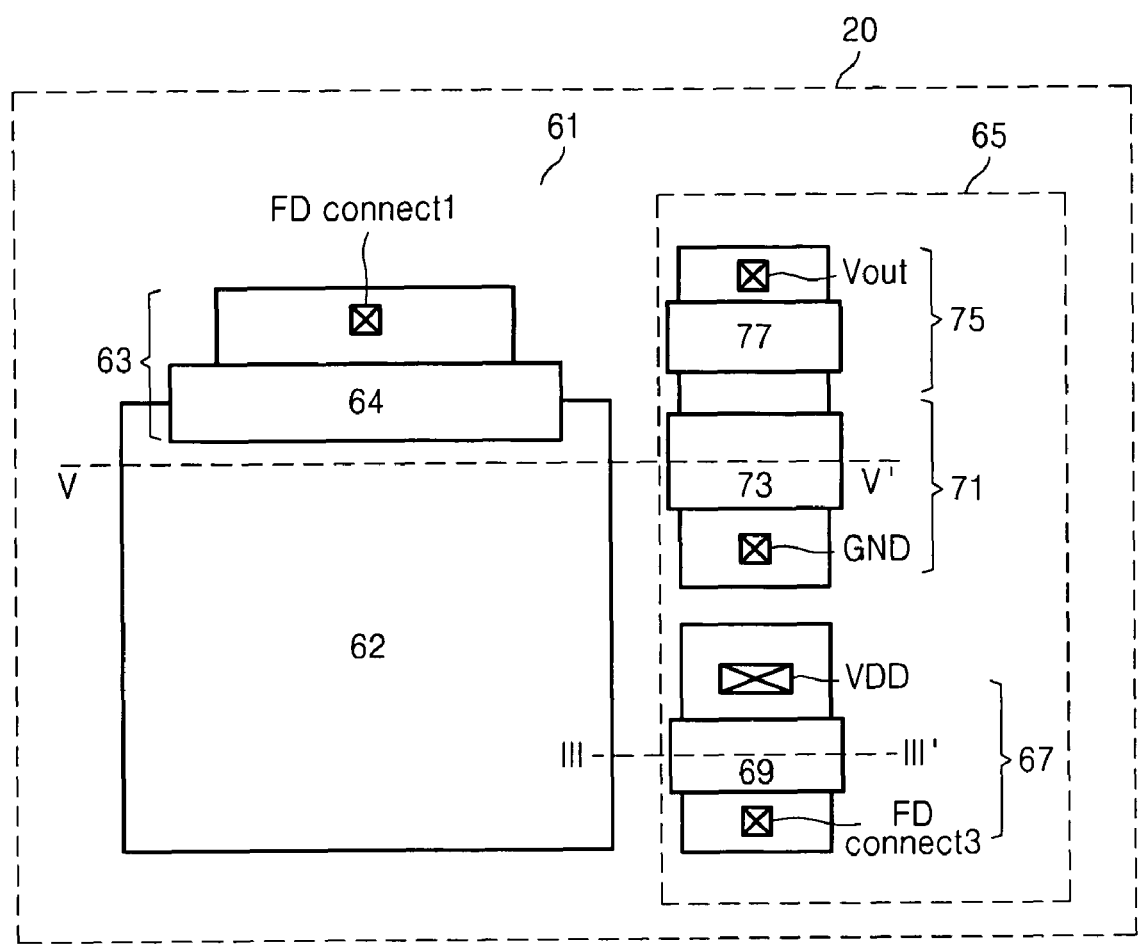
FIG. 3 shows a layout of the pixel of FIG. 2, according to an example embodiment of the present invention.
Figure 4:
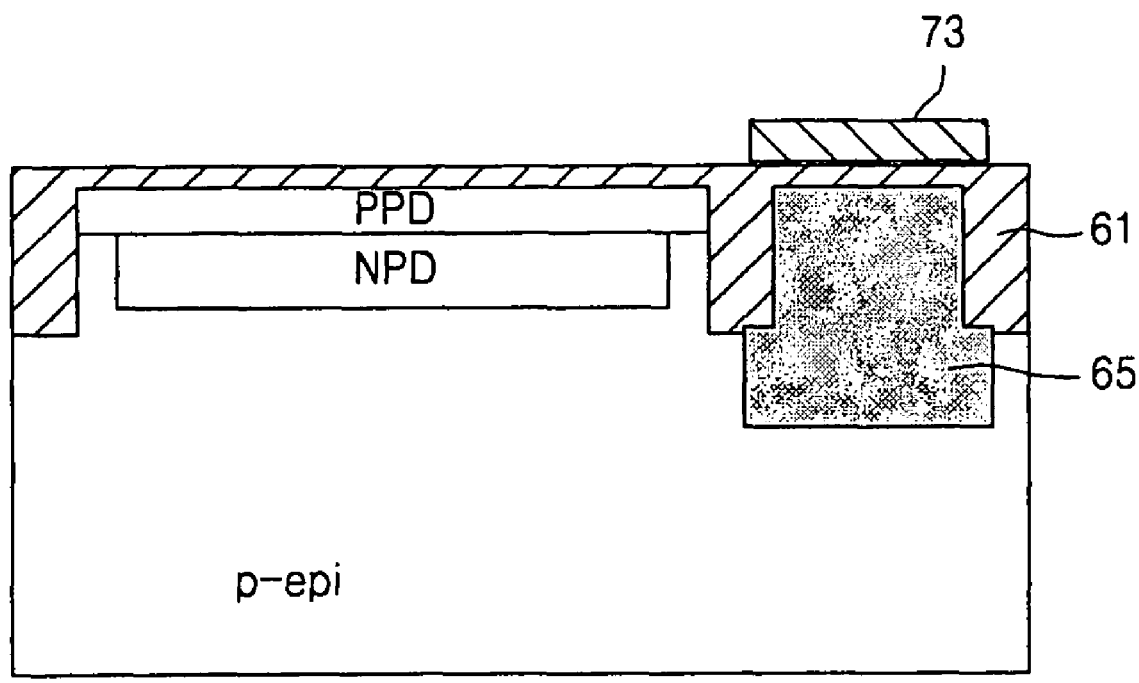
FIG. 4 shows a cross sectional view taken along a line V-V' in the pixel of FIG. 3, according to an example embodiment of the present invention.

FIG. 3 shows a layout of the pixel 20 of FIG. 2, according to an example embodiment of the present invention. FIG. 4 shows a cross sectional view taken along a line V-V' in the pixel 20 of FIG. 3, according to an example embodiment of the present invention.

Referring to FIGS. 2, 3, and 4, the pixel 20 is formed on a semiconductor substrate (p-epi) such as a P-type semiconductor substrate. FIGS. 3 and 4 further show an isolation region 61, a photo sensitive device (PSD) region 62, a transfer transistor region 63, and an N-well region 65. The isolation region 61 is formed in the semiconductor substrate (p-epi) by using shallow trench isolation (STI) or local oxidation of silicon (LOCOS) to define the PSD region 62, the transfer transistor region 63, and the N-well region 65.

Referring to FIG. 4, for forming the photodiode PD, an N-type doped photodiode region NPD is formed in the PSD region 62 of the semiconductor substrate (p-epi). The N-type doped photodiode region NPD generates and accumulates electric charge in response to light received at the photodiode PD. A P+-type pinning layer PPD is formed on the N-type doped photodiode region NPD near a surface of the semiconductor substrate p-epi. The P+-type pinning layer PPD reduces dark current at such a surface of the semiconductor substrate (p-epi) such as a silicon substrate having many dangling bonds in the PSD region 62.

The transfer transistor TG is formed in the transfer transistor region 63 to transfer electric charge generated at the N-type doped photodiode region NPD to a first FD contact (connect1) of the floating diffusion node FD. A gate insulating film is formed below a gate 64 of the transfer transistor TG. A channel region (not shown) for conducting the charge carriers generated by the N-type doped photodiode region NPD is formed below the gate 64 within the semiconductor substrate.

The N-well region 65 drains overflow electrons generated at the PSD region 62. In addition as illustrated in FIG. 3, a reset transistor region 67, a drive transistor region 71, and a select transistor region 75 are formed along a line in the N-well region 65.

The reset transistor RES formed in the reset transistor region 67 resets a second FD contact (connect3) of the floating diffusion node FD to the first power supply voltage VDD in response to the reset control signal. The first FD contact (connect1) and the second FD contact (connect3) are electrically connected with each other. A gate insulating film (not shown) is formed below a gate 69 of the reset transistor RES. A channel region (not shown) for conducting the current of the reset transistor RES is formed below the gate 69 within the N-well region 65.

Figure 5:
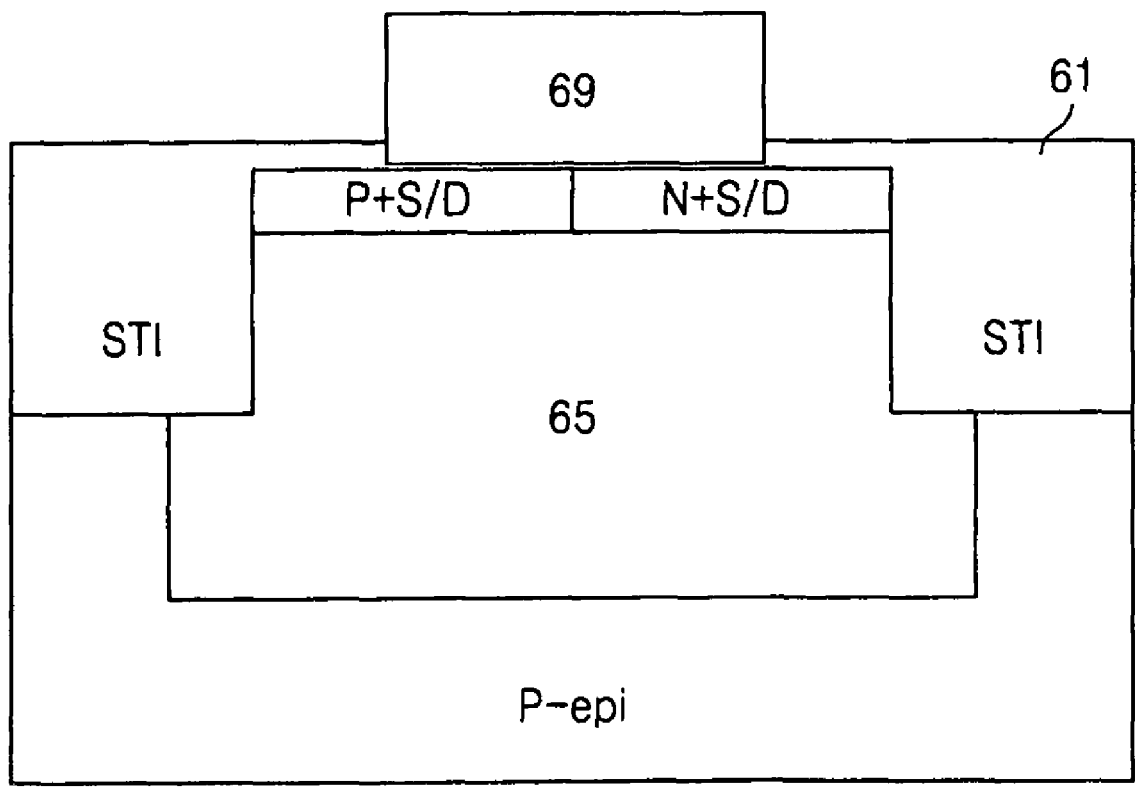
FIG. 5 shows a cross sectional view taken along a line III-III' in the pixel of FIG. 3, according to an example embodiment of the present invention.
Figure 6:
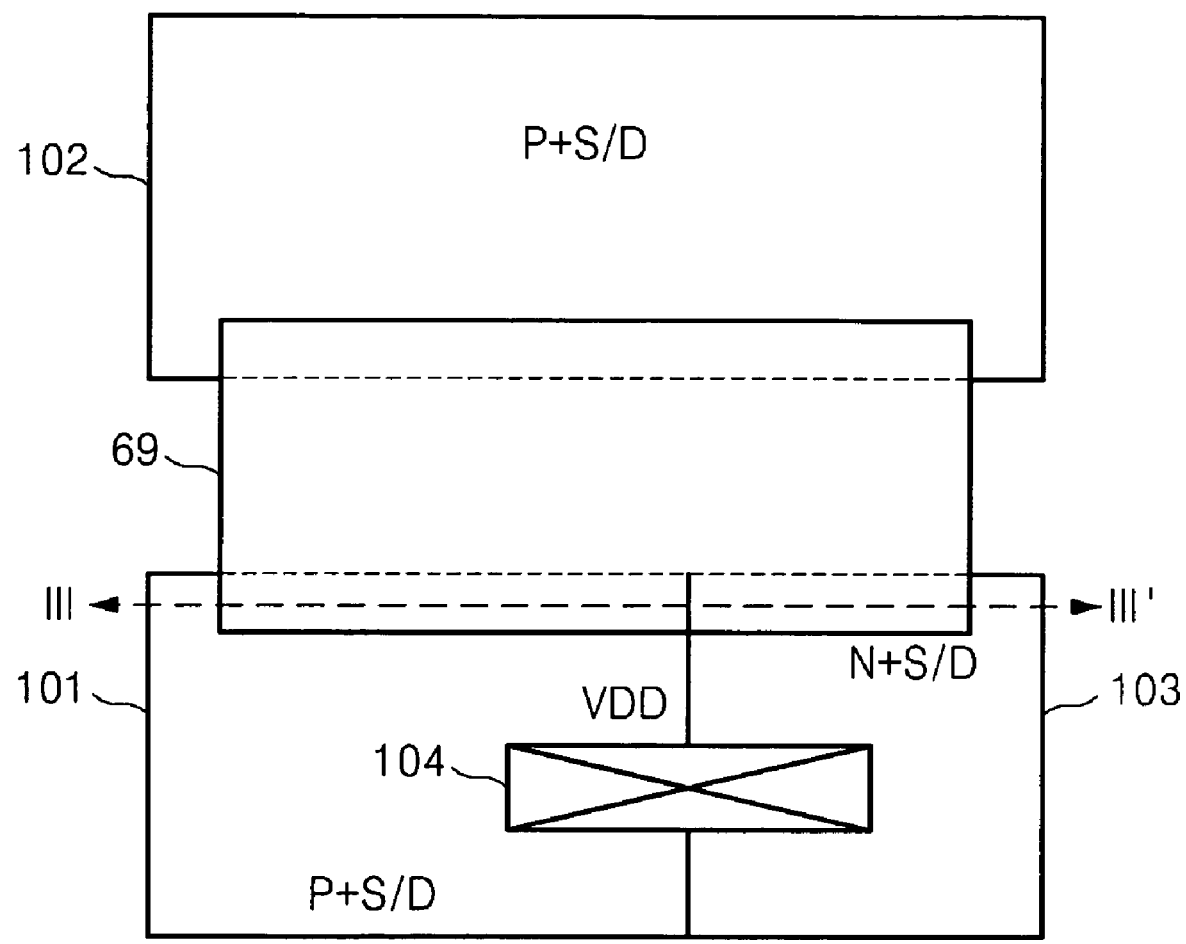
FIG. 6 shows formation of a butting contact in the pixel of FIG. 3, according to an example embodiment of the present invention.

FIG. 5 shows a cross sectional view taken along a line III-III' in the pixel 20 of FIG. 3 (and along the line III-III' in the reset transistor RES of FIG. 6), according to an example embodiment of the present invention. FIG. 6 shows a lay-out of the reset transistor RES with formation of a butting contact 104 in the pixel 20 of FIG. 3, according to an example embodiment of the present invention.

Referring to FIGS. 2, 3, 4, 5, and 6, a first P+ source/drain (S/D) region 101 is formed at a first end of the channel region of the reset transistor RES, and a second P+ source/drain (S/D) region 102 is formed at a second end of the channel region of the reset transistor RES. In addition, an N-well contact region (N+S/D) 103 is formed in the N-well region 65. The butting contact 104 is formed onto both of the first P+ source/drain (S/D) region 101 and the N-well contact region (N+S/D) 103 to electrically connect such regions 101 and 103. The first power supply voltage VDD is applied on the butting contact 104 such that the first power supply voltage VDD is applied on the first P+ source/drain (S/D) region 101 as illustrated in FIG. 2.

In addition, the first P+ source/drain (S/D) region 101 and the N-well contact region (N+S/D) 103 have the same potential VDD applied thereon through the butting contact 104. Thus, separate contact structures are not needed for the N-well region 65 and the first P+ source/drain (S/D) region 101 for minimizing area of the pixel 20.

Referring back to FIGS. 2 and 3, the drive transistor SF is formed in the drive transistor region 71. Referring to FIGS. 2, 3, and 4, a gate insulating film (i.e., a thin portion of the isolation region 61) is formed below a gate 73 of the drive transistor SF. A channel region (not shown) for conducting the current of the drive transistor SF is formed below the gate 73 within the N-well region 65.

The select transistor SEL is formed in the select transistor region 75. A gate insulating film (not shown) is formed below a gate 77 of the select transistor SEL. A channel region (not shown) for conducting the current of the select transistor SEL is formed below the gate 77 within the N-well region 65.

Figure 7:
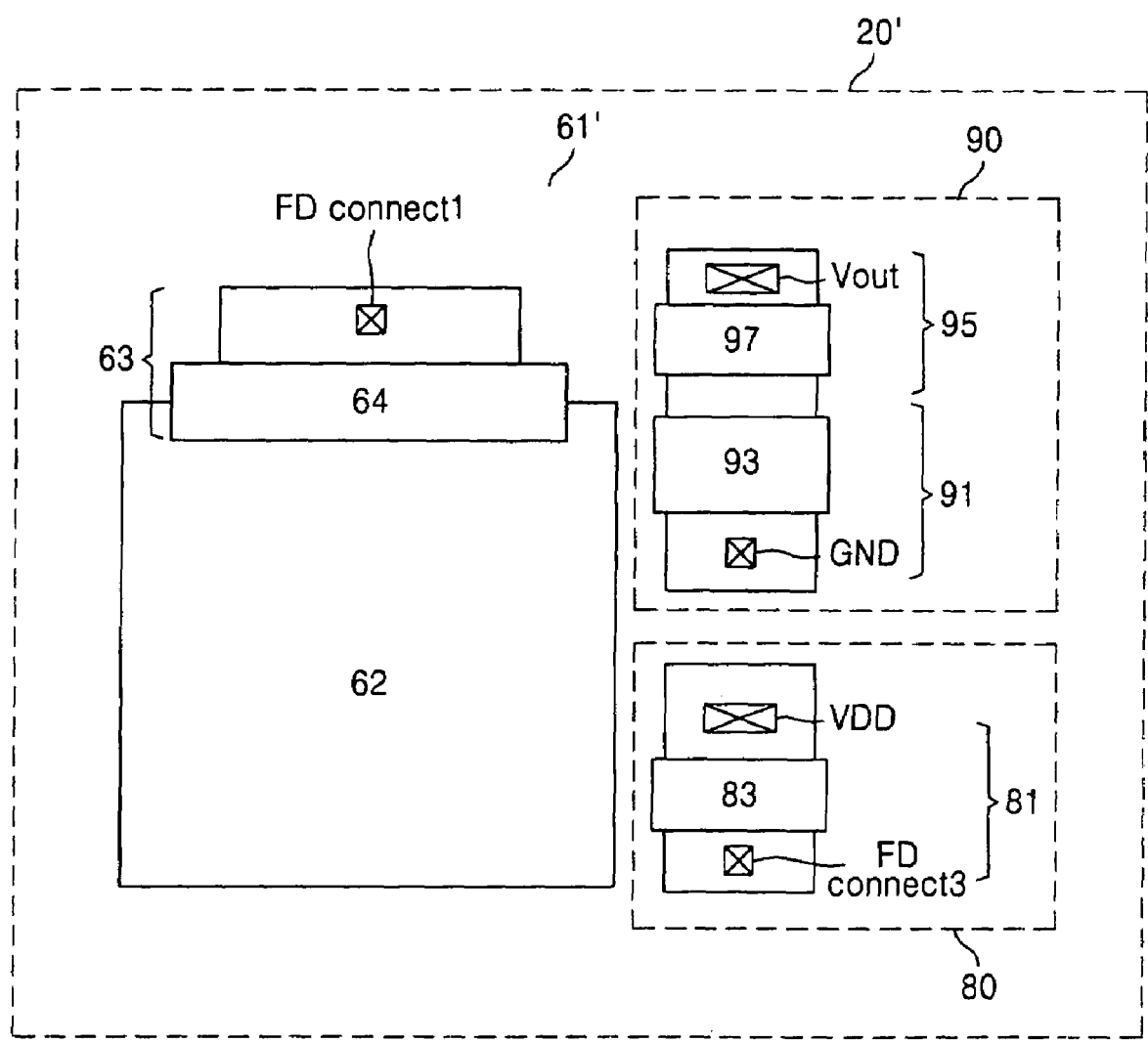
FIG. 7 shows an alternative layout of the pixel of FIG. 2, according to another example embodiment of the present invention.

FIG. 7 shows an alternative layout of the pixel 20' of FIG. 2, according to another example embodiment of the present invention. Referring to FIGS. 2 and 7, the pixel 20' includes an isolation region 61', the PSD region 62, the transfer transistor region 63, a first N-well region 80, and a second N-well region 90. Comparing FIGS. 3 and 7, note that the pixel 20' of FIG. 7 is different from the pixel 20 of FIG. 3 in that the pixel 20' of FIG. 7 includes the two separate N-well regions 80 and 90.

The first N-well region 80 drains overflow electrons generated at the PSD region 62 and includes a reset transistor region 81. The reset transistor RES is formed in the reset transistor region 81 to reset the second FD contact (connect3) of the floating diffusion node FD in response to the reset control signal.

The first FD contact (connect1) and the second FD contact (connect3) are electrically connected with each other. A gate insulating film (not shown) is formed below a gate 83 of the reset transistor RES. A channel region (not shown) for conducting the charge carriers generated from the PSD region 62 is formed below the gate 83 within the first N-well region 80.

Similarly as described for FIGS. 3 and 6, a first source/drain region (P+S/D) at an end of the channel region of the reset transistor RES is electrically connected with a contact region (N+S/D) of the first N-well region 80 via a butting contact having the first power supply voltage VDD applied thereon. With such a butting contact shared by the first source/drain region (P+S/D) of the reset transistor RES and the contact region (N+S/D) of the first N-well region 80, the area of the pixel 20' is minimized.

The second N-well region 90 drains overflow electrons generated at the PSD region 62 and includes a drive transistor region 91 and a select transistor region 95. The drive transistor SF is formed in the drive transistor region 91. A gate insulating film (not shown) is formed below a gate 93 of the drive transistor SF. A channel region (not shown) for conducting the current of the drive transistor SF is formed below the gate 93 within the second N-well region 90.

The select transistor SEL is formed in the select transistor region 95. A gate insulating film (not shown) is formed below a gate 97 of the select transistor SEL. A channel region (not shown) for conducting the current of the select transistor SEL is formed below the gate 97 of the select transistor SEL in the second N-well region 90.

A source/drain region at one end of the channel region of the select transistor SEL is electrically connected with a contact region in the second N-well region 90 through a respective butting contact similar as described in reference to FIG. 6. With such a respective butting contact shared by the source/drain region of the select transistor SEL and the contact region of the second N-well region 90, the area of the pixel 20' is minimized.

Accordingly, the potential of the second N-well region 90 is the same as the potential of the source/drain region of the select transistor SEL (i.e., a potential Vout of a source node), which results in a floating state. Since the potential of the second N-well region 90 is floating, a body effect of the drive transistor SF is reduced such that a gain drop in the drive transistor SF is minimized.

Figure 8:
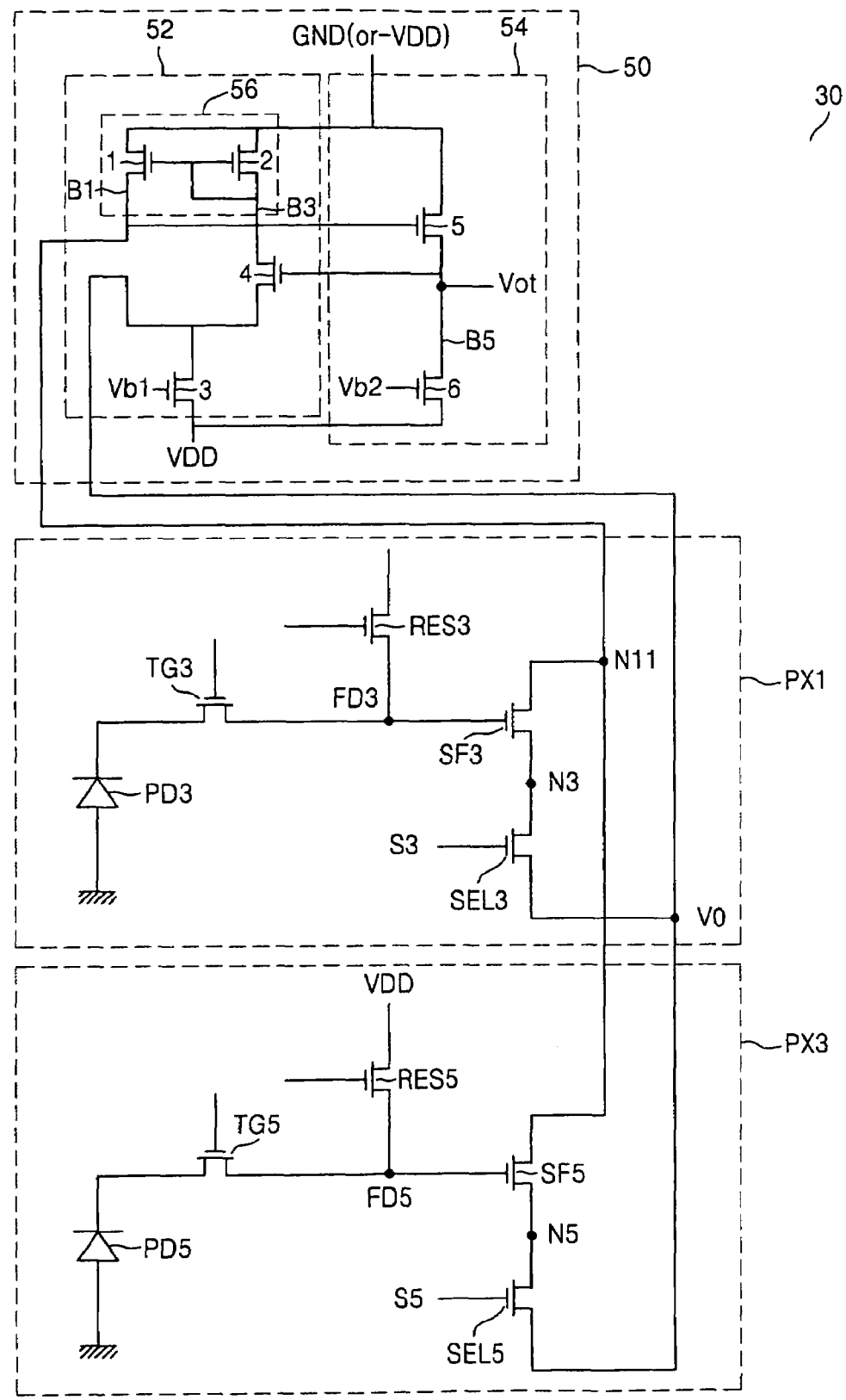
FIG. 8 shows a circuit diagram of example pixels coupled to a current mirror unit in a CMOS image sensor, according to another embodiment of the present invention.

FIG. 8 shows a circuit diagram of example pixels coupled to a current mirror unit in a CMOS image sensor 30, according to another embodiment of the present invention. The CMOS image sensor 30 includes a plurality of pixels such as a first pixel PX1 and a second pixel PX3 and a current mirror unit 50.

The first pixel PX1 includes a respective photodiode PD3, a respective transfer transistor TG3, a respective floating diffusion node FD3, a respective reset transistor RES3, a respective drive transistor SF3, and a respective select transistor SEL3. The respective photodiode PD3, the respective transfer transistor TG3, the respective floating diffusion node FD3, and the respective reset transistor RES3 of the first pixel PX1 have similar structure and function as the photodiode PD, the transfer transistor TG, the floating diffusion node FD, and the reset transistor RES of FIG. 2. Thus, detailed descriptions thereof are omitted.

The respective drive transistor SF3 is connected between a first node N11 and a second node N3. The respective drive transistor SF3 causes the second node N3 to source follow a voltage at the gate of the drive transistor SF3 (i.e., the respective floating diffusion node FD3). The respective select transistor SEL3 is connected between the second node N3 and an output node Vo for forming an electrical path between the second node N3 and the output node Vo in response to a respective select control signal S3.

The second pixel PX3 include a respective photodiode PD5, a respective transfer transistor TG5, a respective floating diffusion node FD5, a respective reset transistor RES5, a respective drive transistor SF5, and a respective select transistor SEL5. The respective photodiode PD5, the respective transfer transistor TG5, the respective floating diffusion node FD5, and the respective reset transistor RES5 have similar function and structure as the photodiode PD, the transfer transistor TG, the floating diffusion node FD, and the reset transistor RES of FIG. 2. Thus, detailed descriptions thereof are omitted.

The respective drive transistor SF5 is connected between the first node N11 and a third node N5. The respective drive transistor SF5 causes the third node N5 to source follow the voltage at the gate of the respective drive transistor SF5 (i.e., the respective floating diffusion node FD5). The select transistor SEL5 is connected between the third node N5 and the output node Vo to form an electrical path between the third node N5 and the output node Vo in response to a respective select control signal S5. The respective select control signals S3 and S5 are generated to not overlap each other such that just one the first and second pixels PX1 and PX3 generates the output at the output node Vo at any one time.

The current mirror unit 50 is biased between the first power supply voltage VDD and the second power supply voltage GND. The present invention may be practiced with the second power supply voltage GND being the ground voltage or being the negative of the first power supply voltage (i.e., −VDD).

The current mirror unit 50 includes a current mirror block with mirroring transistors 1 and 2 configured as a current mirror for forming first and second current branches B1 and B3, respectively. In addition, the current mirror unit 50 includes a first controlling transistor 3, a second controlling transistor 4, a third controlling transistor 5, and a fourth controlling transistor 6. Such transistors 1, 2, 3, 4, 5, and 6 in the current mirror unit 50 are NMOSFETs according to an example embodiment of the present invention.

The third and fourth controlling transistors 5 and 6 form an output block 54. The third and fourth controlling transistors 5 and 6 are connected to each other at a current mirror output node Vot to form a current mirror output line B5.

The first current branch B1 is connected to the respective drive transistors SF3 and SF5 of the pixels PX1 and PX3. The second current branch B3 is coupled to the respective select transistors SEL3 and SEL5 of the pixels PX1 and PX3 via the second controlling transistor 4 at the output node Vo. With such connection of FIG. 8 for biasing the respective drive transistors SF3 and SF5, gain drops of the respective drive transistors SF3 and SF5 are minimized.

The second, third, and fourth controlling transistors 4, 5, and 6 with the connections as illustrated in FIG. 8 and with a second bias voltage Vb2 applied on the gate of the fourth controlling transistors 6 bias the respective drain-to-source voltages of the mirroring transistors 1 and 2.

The current flowing through the first current branch B1 flows to the respective drive transistors SF3 and SF5 of the pixels PX1 and PX3. The first controlling transistor 3 with a first bias voltage Vb1 applied to its gate determines a portion of the current of the second current branch B3 to flow to the output node Vo coupled to the respective select transistors SEL3 and SEL5. The second controlling transistor 4 determines an amount of current flowing in the second branch B3 in response to a voltage at the current mirror output node Vot.

In this manner, the CMOS image sensor including embodiments of the present invention has the floating diffusion node fully reset to the first power supply voltage VDD with minimized 1/f noise. In addition, the CMOS image sensor efficiently performs overflow draining with minimized generation of hot electrons and display noise. The CMOS image sensor also has reduced body effect for minimized gain drop in the drive transistor. Furthermore with formation of the butting contact, the size of the CMOS image sensor is minimized. The CMOS image sensor also has minimized gain drop in the drive transistor by using a current mirror for biasing.

While the present invention has been shown and described with reference to exemplary embodiments thereof, it will be understood by those of ordinary skill in the art that various changes in form and detail may be made herein without departing from the spirit and scope of the present invention, as defined by the following claims.

What is claimed is:

1. An image sensor comprising:
 a drive transistor for being driven according to a voltage at a floating diffusion nodes, wherein the drive transistor is a depletion mode transistor for minimizing generation of noise;
 a select transistor coupled in series with the drive transistor for being turned on when a pixel of said drive transistor is selected, wherein the select transistor has a channel conductivity that is opposite of charge stored at the floating diffusion node for minimizing display noise; and
 a current mirror unit having first and second branches conducting mirrored currents, with the first branch being coupled to the drive transistor and the second branch being coupled to the select transistor at an output node of the pixel.

2. The image sensor of claim 1, further comprising:
 a photosensitive device that accumulates charge in response to received light;
 a transfer transistor coupled between the photosensitive device and the floating diffusion node, wherein the transfer transistor turns on to transfer the charge accumulated in the photosensitive device to the floating diffusion node in response to a transfer control signal; and
 a reset transistor coupled between the floating diffusion node and a first voltage source, wherein the reset transistor turns on to reset the floating diffusion node in response to a reset control signal.

3. The image sensor of claim 2, wherein the photosensitive device is a photodiode including:
 an N-type doped region formed in a P-type semiconductor substrate; and
 a P-type pinning layer formed on the N-type doped region toward a surface of the P-type semiconductor substrate.

4. The image sensor of claim 2, wherein the transfer transistor is an NMOSFET (N-channel metal oxide semiconductor field effect transistor).

5. The image sensor of claim 2, wherein the reset transistor is a PMOSFET (P-channel metal oxide semiconductor field effect transistor).

6. The image sensor of claim 5, further comprising:
 an N-well having the reset PMOSFET formed therein; and
 a butting contact formed onto a drain/source region of the reset transistor and onto a contact region of the N-well, wherein one structure of the butting contact is formed onto said drain/source region of the reset transistor and onto said contact region of the N-well for minimized area of the image sensor.

7. The image sensor of claim 6, wherein the first voltage source applies a power supply voltage on the butting contact.

8. The image sensor of claim 6, wherein the drive transistor and the select transistor are formed in said N-well.

9. The image sensor of claim 8, wherein the drive transistor, the select transistor, and the reset transistor are formed along a line in said N-well.

10. The image sensor of claim 6, further comprising:
 another N-well having the drive transistor and the select transistor formed therein.

11. The image sensor of claim 10, further comprising:
 another butting contact formed onto a drain/source region of the select transistor and onto a contact region of the another N-well,
 wherein an output voltage of the pixel is generated on the another butting contact that is floating for minimizing body of the select transistor.

12. The image sensor of claim 11, wherein the drive transistor and the select transistor are formed along a line in the another N-well.

13. The image sensor of claim 1, wherein the drive transistor is a PMOSFET (P-channel metal oxide semiconductor field effect transistor).

14. The image sensor of claim 13, wherein the drive transistor is a depletion mode PMOSFET (P-channel metal oxide semiconductor field effect transistor) configured as a source follower.

15. The image sensor of claim 1, wherein the select transistor is a PMOSFET (P-channel metal oxide semiconductor field effect transistor).

16. The image sensor of claim 1, wherein the current mirror unit includes:
   mirroring transistors forming the first and second branches; and
   controlling transistors coupled to the mirroring transistors for biasing the mirroring transistors.

17. The image sensor of claim 16, wherein one of the controlling transistors determines a respective portion of the mirrored current flowing to the select transistor at the output node of the pixel.

18. The image sensor of claim 16, wherein the mirroring transistors and the controlling transistors are NMOSFETs (N-channel metal oxide semiconductor field effect transistors).

19. The image sensor of claim 18, wherein the drive transistor and the select transistor are PMOSFETs (P-channel metal oxide semiconductor field effect transistors).

20. The image sensor of claim 1, wherein the image sensor further comprises:
   another pixel including another drive transistor and another select transistor being coupled to the first branch and the second branch, respectively.

* * * * *